United States Patent
Kellogg et al.

(10) Patent No.: US 10,825,656 B2
(45) Date of Patent: Nov. 3, 2020

(54) SYSTEMS AND METHODS FOR CONTROLLING DIRECTIONALITY OF IONS IN AN EDGE REGION BY USING AN ELECTRODE WITHIN A COUPLING RING

(71) Applicant: Lam Research Corporation, Fremont, CA (US)

(72) Inventors: Michael C. Kellogg, San Francisco, CA (US); Alexei Marakhtanov, Albany, CA (US); John Patrick Holland, San Jose, CA (US); Zhigang Chen, Campbell, CA (US); Felix Kozakevich, Sunnyvale, CA (US); Kenneth Lucchesi, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/823,240

(22) Filed: Mar. 18, 2020

(65) Prior Publication Data

US 2020/0227238 A1 Jul. 16, 2020

Related U.S. Application Data

(60) Continuation of application No. 16/165,950, filed on Oct. 19, 2018, now Pat. No. 10,615,003, which is a continuation of application No. 15/825,021, filed on Nov. 28, 2017, now Pat. No. 10,115,568, which is a division of application No. 15/190,082, filed on Jun. 22, 2016, now Pat. No. 9,852,889.

(51) Int. Cl.
*H01J 37/32* (2006.01)
*H01J 37/147* (2006.01)

(52) U.S. Cl.
CPC .... *H01J 37/32155* (2013.01); *H01J 37/1471* (2013.01); *H01J 37/32091* (2013.01); *H01J 37/32366* (2013.01); *H01J 37/32642* (2013.01)

(58) Field of Classification Search
USPC ...... 438/706, 712, 714, 729; 216/58, 67, 68, 216/69, 70; 156/345.33, 345.44, 345.48
See application file for complete search history.

(56) References Cited

U.S. PATENT DOCUMENTS

| 2010/0243606 A1* | 9/2010 | Koshimizu et al. ...... C23F 1/08 216/67 |
| 2018/0025891 A1* | 1/2018 | Marakhtanov et al. ..................... H01J 37/32 216/67 |

* cited by examiner

*Primary Examiner* — Kiet T Nguyen
(74) *Attorney, Agent, or Firm* — Penilla IP, APC

(57) ABSTRACT

Systems and methods for controlling directionality of ion flux at an edge region within a plasma chamber are described. One of the systems includes a radio frequency (RF) generator that is configured to generate an RF signal, an impedance matching circuit coupled to the RF generator for receiving the RF signal to generate a modified RF signal, and a plasma chamber. The plasma chamber includes an edge ring and a coupling ring located below the edge ring and coupled to the first impedance matching circuit to receive the modified RF signal. The coupling ring includes an electrode that generates a capacitance between the electrode and the edge ring to control the directionality of the ion flux upon receiving the modified RF signal.

20 Claims, 13 Drawing Sheets

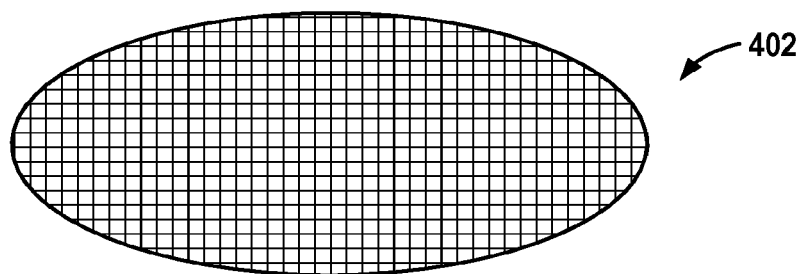
FIG. 4A (Mesh electrode within coupling ring)
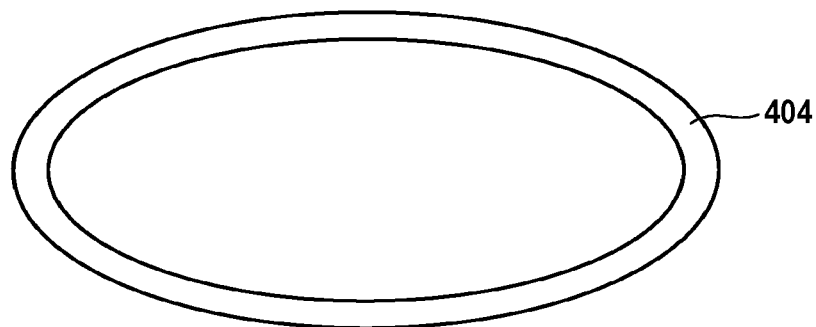
FIG. 4B (Ring-shaped electrode within coupling ring)

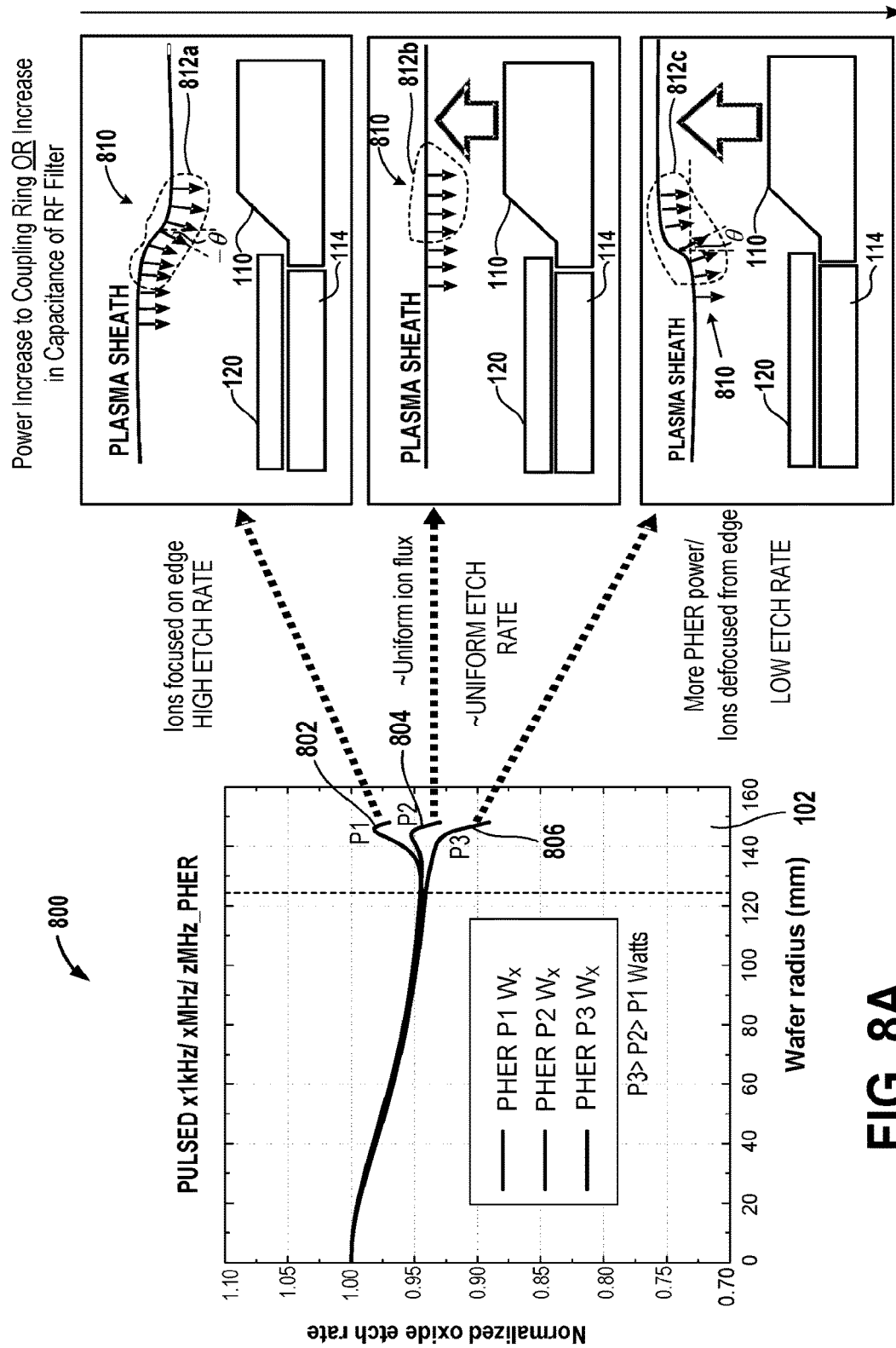

(Increase in capacitance increases voltage applied to plasma from bottom)

SYSTEMS AND METHODS FOR CONTROLLING DIRECTIONALITY OF IONS IN AN EDGE REGION BY USING AN ELECTRODE WITHIN A COUPLING RING

CLAIM OF PRIORITY

The present patent application is a continuation of and claims the benefit of and priority, under 35 U.S.C. § 120, to U.S. patent application Ser. No. 16/165,950, filed on Oct. 19, 2018, and titled "SYSTEMS AND METHODS FOR CONTROLLING DIRECTIONALITY OF IONS IN AN EDGE REGION BY USING AN ELECTRODE WITHIN A COUPLING RING", which is a continuation of and claims the benefit of and priority, under 35 U.S.C. § 120, to U.S. patent application Ser. No. 15/825,021, filed on Nov. 28, 2017, titled "SYSTEMS AND METHODS FOR CONTROLLING DIRECTIONALITY OF IONS IN AN EDGE REGION BY USING AN ELECTRODE WITHIN A COUPLING RING", now issued as U.S. Pat. No. 10,115,968, which is a divisional of and claims the benefit of and priority, under 35 U.S.C. § 120, to U.S. patent application Ser. No. 15/190,082, filed on Jun. 22, 2016, and titled "SYSTEMS AND METHODS FOR CONTROLLING DIRECTIONALITY OF IONS IN AN EDGE REGION BY USING AN ELECTRODE WITHIN A COUPLING RING", now issued as U.S. Pat. No. 9,852,889, all of which are incorporated by reference herein in their entirety.

FIELD

The present embodiments relate to systems and methods for controlling directionality of ions in an edge region of a plasma chamber by using an electrode within a coupling ring.

BACKGROUND

Plasma systems are used to control plasma processes. A plasma system includes multiple radio frequency (RF) sources, an impedance match, and a plasma reactor. A workpiece is placed inside the plasma chamber and plasma is generated within the plasma chamber to process the workpiece.

It is important that the workpiece be processed in a similar or uniform manner. To process the workpiece in a similar or uniform manner, various parameters associated with the plasma reactor are controlled. As an example, it is important to control directionality of ion flux during processing of the workpiece. The control in directionality helps increase an etch rate and achieve a certain aspect ratio of features of the workpiece.

With the processing of the workpiece in the uniform manner, it is important to simultaneously maintain lifetime of various components of the plasma chamber. With an application of RF power to some of the components, the components wear faster and do not last for their lifetime. Moreover, due to such wear, the components adversely affect the directionality of ion flux, which adversely affects the uniformity in processing of the workpiece.

It is in this context that embodiments described in the present disclosure arise.

SUMMARY

Embodiments of the disclosure provide apparatus, methods and computer programs for controlling directionality of ions in an edge region of a plasma chamber by using an electrode within a coupling ring. It should be appreciated that the present embodiments can be implemented in numerous ways, e.g., a process, an apparatus, a system, a piece of hardware, or a method on a computer-readable medium. Several embodiments are described below.

It is difficult to meet process specifications at the edge of a wafer due to a tradeoff between a profile angle or tilt at which the wafer is etched and an etch rate. The etch rate depends upon ion flux at the edge of the wafer and chemistry, e.g., mixture, types, etc., of one or more process gases used to process the wafer. The ion flux at the edge reaching the wafer is a function of ion flux that enters the plasma sheath and the shape of the plasma sheath at the edge. The ion focusing effect is a function of a difference in wafer plasma sheath thickness above the wafer and edge ring plasma sheath thickness above the edge ring that controls the plasma sheath beyond the edge of the wafer. It is important to maintain a uniform plasma density beyond the edge of the wafer and minimize the difference between the wafer plasma sheath and the edge ring plasma sheath to improve the etch rate and to maintain a profile angle to be about 90 degrees, e.g., between 89.5 degrees and 90.5 degrees, between 89 degrees and 91 degrees, etc. Also, it is desirable to control wear of the edge ring so that the edge ring is used for its lifetime, e.g., greater than 500 hours, etc.

In some embodiments, a knob for independent control of plasma parameters associated with the edge ring is provided. The knob is provided by embedding a powered electrode in a coupling ring, and providing radio frequency (RF) power to the electrode or by coupling the electrode via a variable impedance RF filter to ground. The providing of the RF power is sometimes referred to as providing active power to the electrode and the coupling of the electrode via the variable impedance to ground is sometimes referred to as providing passive power to the electrode. There is no optimization in upper electrode step location, edge ring height and shape, edge ring coupling materials, etc., to control the plasma parameters. However, in some embodiments, the upper electrode step location, the edge ring height and shape, and/or the edge ring materials are controlled in addition to the active or passive power provided to the electrode to control the plasma parameters.

In various embodiments, a capacitively coupled RF powered edge ring is described for improving performance at the edge of the wafer. By varying an amount of the active or passive power coupled to the edge ring, plasma density of the plasma at the edge region, sheath uniformity of the plasma at the edge region, etch rate uniformity of the plasma at the edge region, and tilt at which the wafer is etched in the edge region are controlled. There is no provision of RF or direct current (DC) power directly to the edge ring. The capacitive coupling of power to the edge ring reduces, e.g., eliminates, etc., chances of any arcing between the materials of the edge ring and RF feed parts used to deliver power directly to the edge ring.

In some embodiments, a system for controlling directionality of ion flux at the edge region within a plasma chamber is described. The system includes an RF generator that is configured to generate an RF signal, an impedance matching circuit coupled to the RF generator for receiving the RF signal to generate a modified RF signal, and the plasma chamber. The plasma chamber includes the edge ring and the coupling ring located below the edge ring and coupled to the impedance matching circuit to receive the modified RF signal. The coupling ring includes the electrode that generates a capacitance between the electrode and the edge ring to control the directionality of the ion flux upon receiving the modified RF signal.

In various embodiments, a system for controlling directionality of ion flux at the edge region within a plasma chamber is described. The system includes a first RF filter that is configured to output a first filtered RF signal, a second RF filter coupled to the first RF filter for receiving the first filtered RF signal to output a second filtered RF signal, and a plasma chamber. The plasma chamber includes the edge ring and the coupling ring located below the edge ring and coupled to the second RF filter. The coupling ring includes the electrode configured to receive the second filtered RF signal to further generate a capacitance between the electrode and the edge ring to control the directionality of the ion flux upon receiving the second filtered RF signal.

In some embodiments, a system for controlling directionality of ion flux at the edge region within a plasma chamber is described. The system includes an RF filter that is configured to output a filtered RF signal and a plasma chamber. The plasma chamber includes the edge ring, and the coupling ring located below the edge ring and coupled to the RF filter to receive the filtered RF signal. The coupling ring includes the electrode that generates a capacitance between the electrode and the edge ring to control the directionality of the ion flux upon receiving the filtered RF signal.

Some advantages of the herein described systems and embodiments include achieving the approximately 90 degree profile angle. An amount of the active or passive power supplied to the electrode within the coupling ring that is coupled to the edge ring is changed to achieve the 90 degree profile angle. Ion flux is measured and the ion flux is controlled based on the measurement. The ion flux is controlled by controlling an active power source or a passive power source that is coupled to the electrode within the coupling ring to change a capacitance between the electrode and the edge ring. The capacitance is changed to achieve the approximately 90 degree profile angle. The capacitance is used to control a voltage of the edge ring to further control the etch rate of etching the wafer at the edge region. The voltage of the edge ring is proportional to an impedance of the edge ring compared to ground. The profile angle helps achieve an edge profile, e.g., a top CD, a bow CD, etc., uniformity that is less than a pre-determined amount, e.g., less than 3%, less than 2%, less than 4%, etc.

Moreover, other advantages of the herein described systems and methods include extension of the edge ring lifetime by varying edge ring voltage. Once the edge ring is worn, e.g., has reduced height, etc., the plasma sheath is bent and ion flux becomes focused on the wafer edge. As a result, edge tilt becomes out of a range defined in a specification. Adjusting the edge ring voltage leads to more uniform plasma sheath and puts wafer edge process parameters back into the range defined in the specification. By implementing the electrode within the coupling ring instead of the edge ring, lifetime of the edge ring is increased.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 4A is a diagram of an embodiment of a mesh electrode, which is an example of the electrode embedded within the coupling ring.

FIG. 4B is a diagram of an embodiment of a ring shaped electrode, which is another example of the electrode.

FIG. 8A is an embodiment of a graph to illustrate a change in a normalized etch rate of a wafer that is processed within the plasma chamber with a change in an amount of power that is supplied to the electrode.

FIG. 8B is a diagram of a portion of the plasma chamber to illustrate a change in directionality of ion flux with a change in an amount of power that is supplied to the electrode.

DETAILED DESCRIPTION

The following embodiments describe systems and methods for controlling directionality of ions in an edge region of a plasma chamber by using an electrode within a coupling ring. It will be apparent that the present embodiments may be practiced without some or all of these specific details. In other instances, well known process operations have not been described in detail in order not to unnecessarily obscure the present embodiments.

Figure 1:
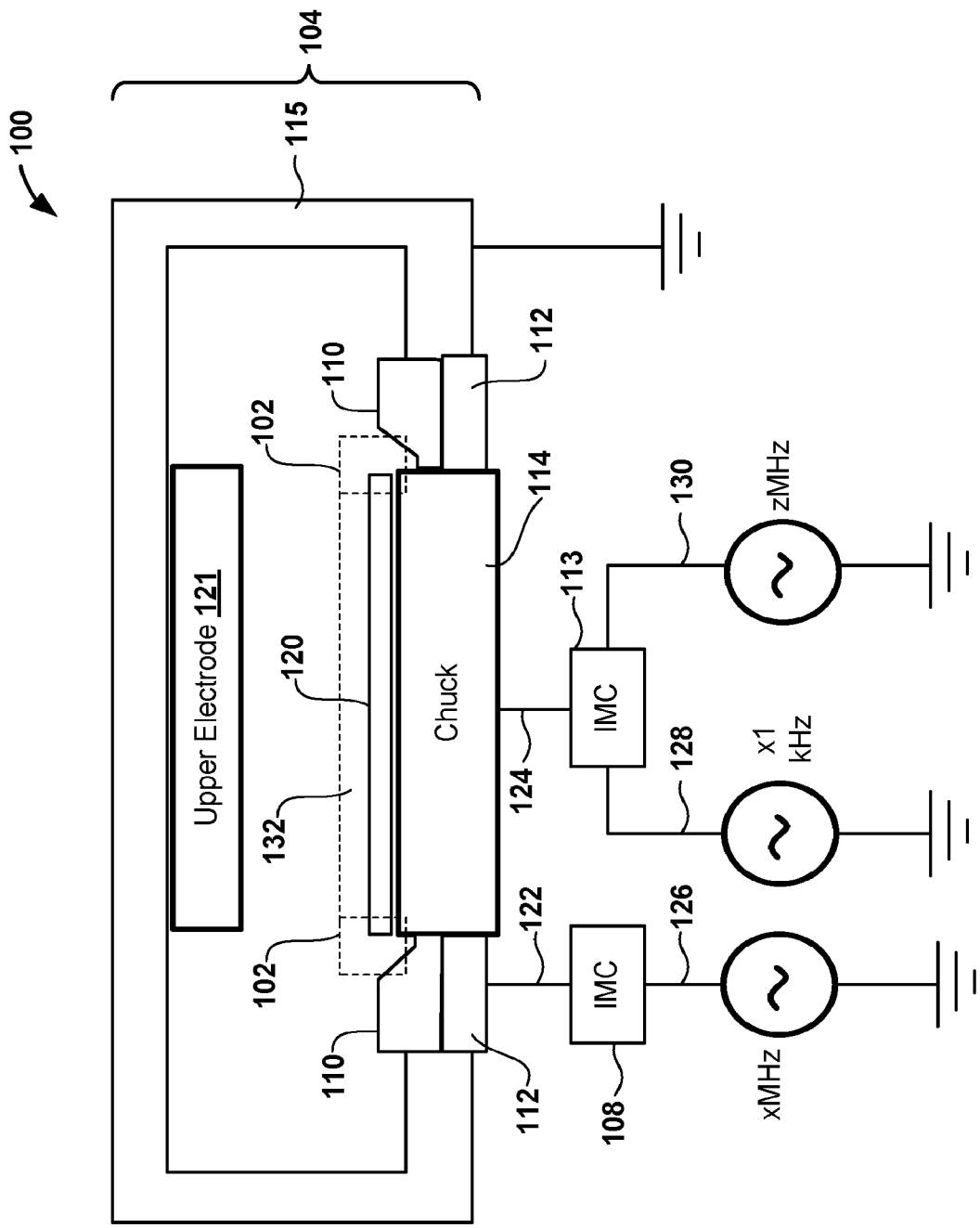
FIG. 1 a diagram of an embodiment of a plasma system to illustrate controlling directionality of ions in an edge region of a plasma chamber by using a coupling ring.

FIG. 1 is a diagram of an embodiment of a plasma system 100 to illustrate controlling directionality of ions in an edge region 102 of a plasma chamber 104 by using a coupling ring 112. The plasma system 100 includes an x megahertz (MHz) radio frequency (RF) generator, a z MHz RF generator, an x1 kilohertz (kHz) RF generator, an impedance matching circuit (IMC) 108, another IMC 113, and the plasma chamber 104. The plasma chamber 104 includes an edge ring 110, the coupling ring 112, and a chuck 114, e.g., an electrostatic chuck (ESC), etc. The edge ring 110 performs many functions, including positioning the substrate 120 on the chuck 114 and shielding the underlying components, of the plasma chamber 104, not protected by substrate 120 from being damaged by the ions of the plasma formed within the plasma chamber 104. The chuck 114, e.g., a lower electrode, etc., is made of a metal, e.g., anodized aluminum, alloy of aluminum, etc.

The coupling ring 112 is located below the edge ring 110 and is coupled to the edge ring 110. The coupling ring 112 is made from an electrical insulator material, e.g., a dielectric material, ceramic, glass, composite polymer, aluminum oxide, etc. The edge ring 110 confines plasma to an area above a substrate 120 and/or protects the chuck 114 from erosion by the plasma. The edge ring 110 is made from one or more materials, e.g., crystal silicon, polycrystalline silicon, silicon carbide, quartz, aluminum oxide, aluminum nitride, silicon nitride, etc. Both the edge ring 110 and the coupling ring 112 are located besides the chuck 114. An edge of the substrate 120 is placed over the edge ring 110 and the edge of the edge ring 110 is located in the edge region 102. As an example, the edge region 102 extends from the edge ring 110 by a pre-determined distance of 10 millimeters to 15 millimeters along a radius of the chuck 114 from an edge of the chuck 114. The plasma chamber 104 has a chamber wall 115, which is coupled to ground.

The x MHz RF generator is coupled via an RF cable 126, the IMC 108 and an RF transmission line 122 to the coupling ring 112. Moreover, the x1 kHz RF generator and the z MHz RF generators are coupled via the IMC 113 and another RF transmission line 124 to the chuck 114. An RF transmission line includes an RF rod and an insulator sleeve that surrounds the RF rod. The x1 kHz RF generator is coupled to the IMC 113 via an RF cable 128 and the z MHz RF generator is coupled to the IMC 113 via an RF cable 130. Examples of the x1 kHz RF generator include a generator having a frequency of operation of 400 kHz, a generator having a frequency of operation ranging between 360 kHz and 440 kHz, etc. Examples of the x MHz RF generator include a generator having a frequency of operation of 2 MHz, a generator having a frequency of operation of 27 MHz etc. Example of the z MHz RF generator include a generator having a frequency of operation of 27 MHz, a generator having a frequency of operation of 60 MHz, etc.

The x1 kHz generates an RF signal and sends the RF signal to the IMC 113. Similarly, the z MHz RF generator generates an RF signal and sends the RF signal to the IMC 113. The IMC 113 matches an impedance of a load, e.g., the RF transmission line 124, the plasma chamber 104, etc., coupled to an output of the IMC 113 with that of a source, e.g., the RF cable 128, the RF cable 130, the x1 kHz RF generator and the z MHz RF generator, etc., coupled to inputs of the IMC 113 to provide a modified RF signal at its output. Similarly, the IMC 108 matches an impedance of a load, e.g., the plasma chamber 104, the RF transmission line 112, etc., that is coupled an output of the IMC 108 with that of a source, e.g., the x MHz RF generator, the RF cable 126, etc., that is coupled an input of the IMC 108 to provide a modified RF signal at its output.

The modified RF signal at the output of the IMC 113 is sent to the chuck 114 to modify an impedance of plasma, e.g., to generate and maintain plasma, etc., within the plasma chamber 104 at a center region 132 of the plasma chamber 104. The center region 132 is located adjacent to the edge region 102 and is surrounded by the edge region 102. The center region extends from one end of the edge region 102 via a center of the chuck 114 to an opposite end of the edge region 102. Moreover, the modified RF signal at the output of the IMC 108 is sent to the coupling ring 112 to modify an impedance of plasma and a directionality of ions within the edge region 102 of the plasma chamber 104. The plasma is generated or maintained when one or more process gases, e.g., oxygen containing gas, fluorine containing gas, etc., are supplied via an upper electrode 121 to the center region 132 of the plasma chamber 104.

The upper electrode 121 faces the chuck 114 and a gap is formed between the upper electrode 121 and the chuck 114. The upper electrode 121 is located within the plasma chamber 104 and is made of a conductive material. The plasma within the plasma chamber 104 is used to process the substrate 120. For example, the plasma is used to etch the substrate 120, to deposit materials on the substrate 120, to clean the substrate 120, etc.

In some embodiments, the plasma chamber 104 includes additional parts, e.g., an upper electrode extension that surrounds the upper electrode 121, a dielectric ring between the upper electrode 121 and the upper electrode extension, confinement rings located besides edges of the upper electrode 121 and the edge ring 110 to surround the gap within the plasma chamber 104, etc.

In various embodiments, the RF signal that is generated by the x MHz RF generator is synchronized with the RF signal that is generated by the x1 kHz RF generator and with the RF signal that is generated by the z MHz RF generator. For example, at a time the RF signal generated by the x MHz RF generator is pulsed from a low state to a high state, the RF signal that is generated by the x1 kHz RF generator is pulsed from the low state to the high state, and the RF signal that is generated by the z MHz RF generator is pulsed from the low state to the high state. As another example, at a time the RF signal generated by the x MHz RF generator is pulsed from the high state to the low state, the RF signal that is generated by the x1 kHz RF generator is pulsed from the high state to the low state, and the RF signal that is generated by the z MHz RF generator is pulsed from the high state to the low state. The high state for an RF signal has a higher level, e.g., root mean square value, peak-to-peak amplitude, etc., of power of the RF signal compared to the low state for the RF signal.

In some embodiments, the RF signal that is generated by the x MHz RF generator is not synchronized with the RF signal that is generated by the x1 kHz RF generator, or is not synchronized with the RF signal that is generated by the z MHz RF generator, or is not synchronized with the RF signal that is generated by the x1 kHz RF generator and is not synchronized with the RF signal that is generated by the z MHz RF generator.

Figure 2A:
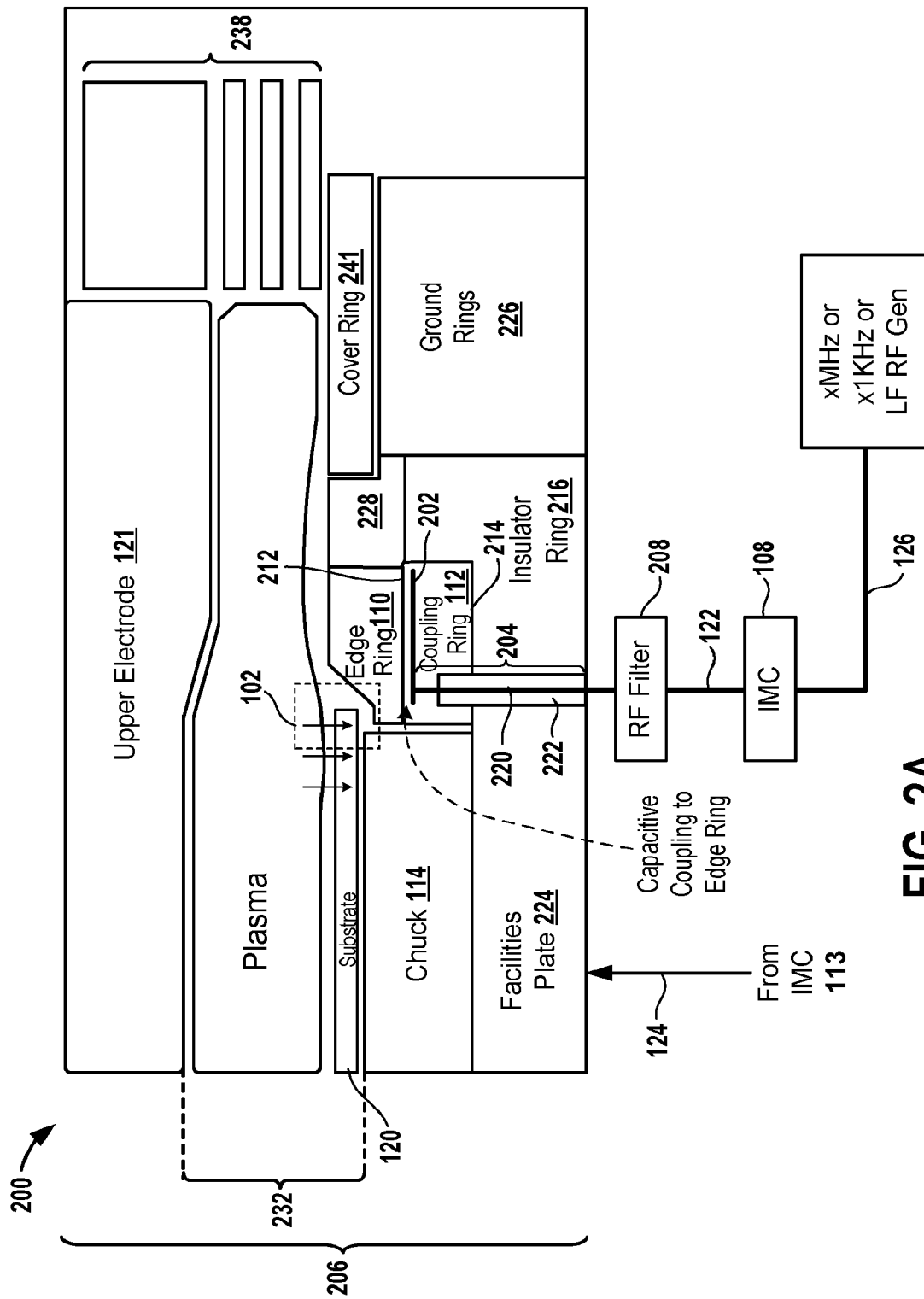
FIG. 2A is a diagram of an embodiment of a system to illustrate coupling of an electrode within the coupling ring to an impedance matching circuit (IMC) via a radio frequency (RF) filter and providing active power to the electrode.

FIG. 2A is a diagram of an embodiment of a system 200 to illustrate coupling of an electrode 202 within the coupling ring 112 to the IMC 108 via an RF filter 208 and providing active power to the electrode 202. The RF filter 208 reduces an amount of RF current from reaching the x1 kHz RF generator or the x MHz RF generator that is coupled to the RF filter 208 via the IMC 108 to prevent any damage by RF power of the RF current to the x1 kHz RF generator or the x MHz RF generator and any component of an RF delivery system between IMC 108 and the electrode 202. As an example, the RF filter 208 includes one or more capacitors, or one or more inductors, or a combination of the capacitors and inductors. The RF current is generated by the plasma within the plasma chamber 206.

The system 200 includes a plasma chamber 206, which is an example of the plasma chamber 104 (FIG. 1). The system 200 further includes the x MHz RF generator or the x1 kHz RF generator, the IMC 108, and the RF filter 208. The x MHz RF generator or the x1 kHz RF generator is coupled via the RF cable 126 to the IMC 108, which is coupled via the RF transmission line 122 to the RF filter 208. The RF filter 208 is coupled via a power pin 204 to the electrode 202. The electrode 202 is embedded within the coupling ring 112. For example, no portion of the electrode 202 is exposed outside the coupling ring 112. As another example, the electrode 202 is embedded within the coupling ring 112 to be closer to an upper surface 212 of the coupling ring 112 compared to a lower surface 214 of the coupling ring 112. The upper surface 212 is adjacent to the edge ring 110 and the lower surface 214 is adjacent to an insulator ring 216 of the plasma chamber 206. The insulator ring 216 is located below the coupling ring 112 and is made of an electrical insulating material, e.g., quartz, etc.

The power pin 204 includes a coax cable 220 and a sleeve 222. The sleeve 222 covers the coax cable 220 to insulate the coax cable 220 from electrical fields surrounding the coax cable 220. The sleeve 222 is made of an electrical insulator material, e.g., plastic, glass, a combination of plastic and glass, etc. The power pin 204 is coupled to the electrode 202 and is coupled via a feed ring to an RF transmission line, which is coupled to the RF filter 208. As an example, the feed ring is made of a conductive metal, e.g., aluminum, copper, etc. A portion of the power pin 204 is located besides the insulator ring 216, a facilities plate 224, and the remaining portion of the power pin 204 is surrounded by the coupling ring 112. The facilities plate 224 is made from a metal, e.g., aluminum, etc.

The facilities plate 224 is located below the chuck 114 and is coupled to the RF transmission line 124. Multiple ground rings 226, which are made of a metal, e.g., aluminum, etc., surround a portion of an insulator ring 228 and the insulator ring 216, and are connected to ground. The insulator ring 228 is made from an insulating material, e.g., quartz, etc., and protects the edge ring 110 from being coupled with direct current (DC) power.

The plasma chamber 206 further includes the upper electrode 121 that faces the chuck 114. A gap 232 is formed between the upper electrode 121 and the chuck 114. Plasma is formed within the gap 232 for processing the substrate 120. Multiple confinement rings 238 are stacked to surround the gap 232 and a portion of the upper electrode 121. The confinement rings 238 are opened or closed via a motor mechanism to control pressure within the gap 232 and/or to control an amount of plasma flowing out from the gap 232 to one or more vacuum pumps located below the plasma chamber 206. A cover ring 241, e.g., a quartz cover ring, etc., is overlaid on top of the ground rings 226 to protect the ground rings 226 from RF power of the plasma.

The x MHz RF generator or the x1 kHz RF generator supplies an RF signal to the IMC 108. The IMC 108 matches an impedance of a load, e.g., the RF transmission line 122, the RF filter 208, and the plasma chamber 206 with that of a source, e.g., the RF cable 126 and the x MHz RF generator or the x1 kHz RF generator, etc., to generate a modified RF signal. The modified RF signal passes via RF transmission line 122, the RF filter 208, the feed ring and the power pin 204 to the electrode 202. The reception of the modified RF signal by the electrode 202 changes impedance of the plasma within the edge region 102, a portion of which is located within the gap 232. The change in impedance is used to change a directionality of ion flux within the edge region 102 to control plasma processing, e.g., etching, deposition, cleaning, etc., of the substrate 120 within the edge region 102.

In one embodiment, the system 200 excludes the RF filter 208 and IMC 108 is coupled via the RF transmission line 122 to the feed ring.

Figure 2B:
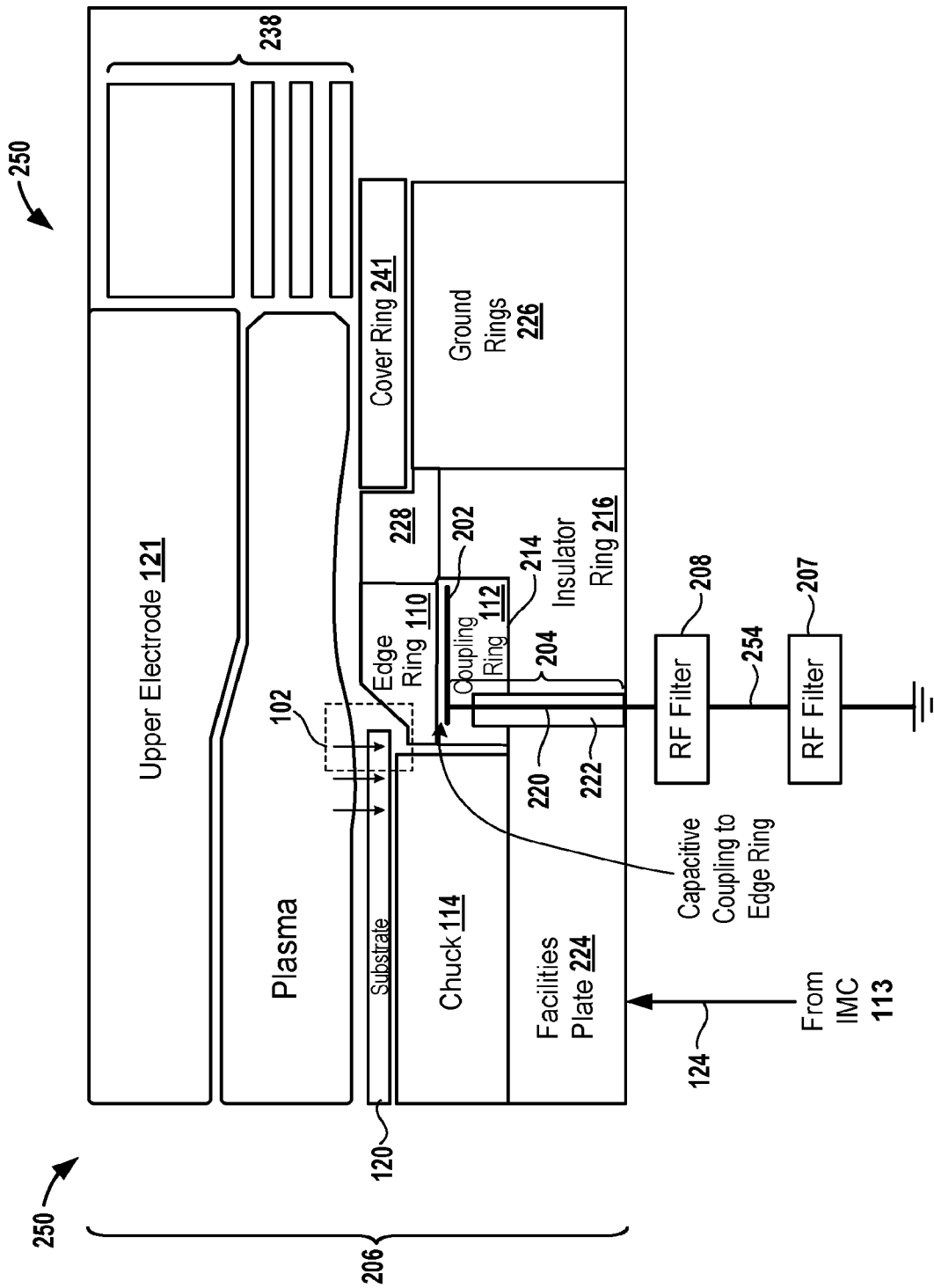
FIG. 2B is a diagram of an embodiment of a system to illustrate providing passive power to the electrode embedded within the coupling ring.

FIG. 2B is a diagram of an embodiment of a system 250 to illustrate providing passive power control to the electrode 202 embedded within the coupling ring 112. The system 250 is the same as the system 200 except that the system 250 includes an RF filter 207 that is coupled to the RF filter 208 via an RF cable 254 at its output and is coupled to ground. The RF filter 207 includes one or more capacitors, or one or more inductors, or a combination of the capacitors and inductors. For example, the RF filter 207 includes a capacitor in parallel with an inductor. As another example, the RF filter 207 includes a capacitor. As yet another example, the RF filter 207 includes a capacitor in series with an inductor. In one embodiment, one or more capacitors of the RF filter 207 are variable and one or more inductors of the RF filter 207 are variable.

The RF filter 207 provides an impedance path to ground to an RF signal that is received from the plasma within the edge region 102. An RF signal is generated from the plasma within the edge region 102 and flows via the edge ring 110 and the capacitance between the electrode 202 and the edge ring 110 to the electrode 202, which outputs an RF signal. The RF signal from the electrode 202 passes through the power pin 204 and the feed ring to the RF filter 208. The RF filter 208 filters out any DC power within the RF signal to output a filtered RF signal. The filtered RF signal passes via the RF cable 254 and the RF filter 207 to ground. A capacitance, or an inductance, or a combination of the capacitance and inductance of the RF filter 207 determines an amount of the filtered RF signal that flows to ground to modify the impedance of the plasma within the edge region 102 to further control the directionality of the ion flux in the edge region 102.

In various embodiments, the RF filter 207 filters a portion of the RF signal that is received from the plasma within the edge region 102 to output a filtered signal via the RF transmission line 254 to the RF filter 208. The portion of the RF signal flows to the ground that is coupled to the RF filter 207. The filtered signal received by the RF filter 208 via the RF transmission line 254 is filtered by the RF filter 208 to remove DC power to output a filtered signal to the coax cable 220 of the power pin 204. The filtered signal is provided via the coax cable 220 to the electrode 202 to change a capacitance between the electrode 202 and the edge ring 110. The capacitance is changed to change an impedance of plasma within the edge region 102.

In some embodiments, the RF filter 208 is excluded and the RF filter 207 is coupled to the power pin 204 via the RF transmission line 254.

Figure 3A:
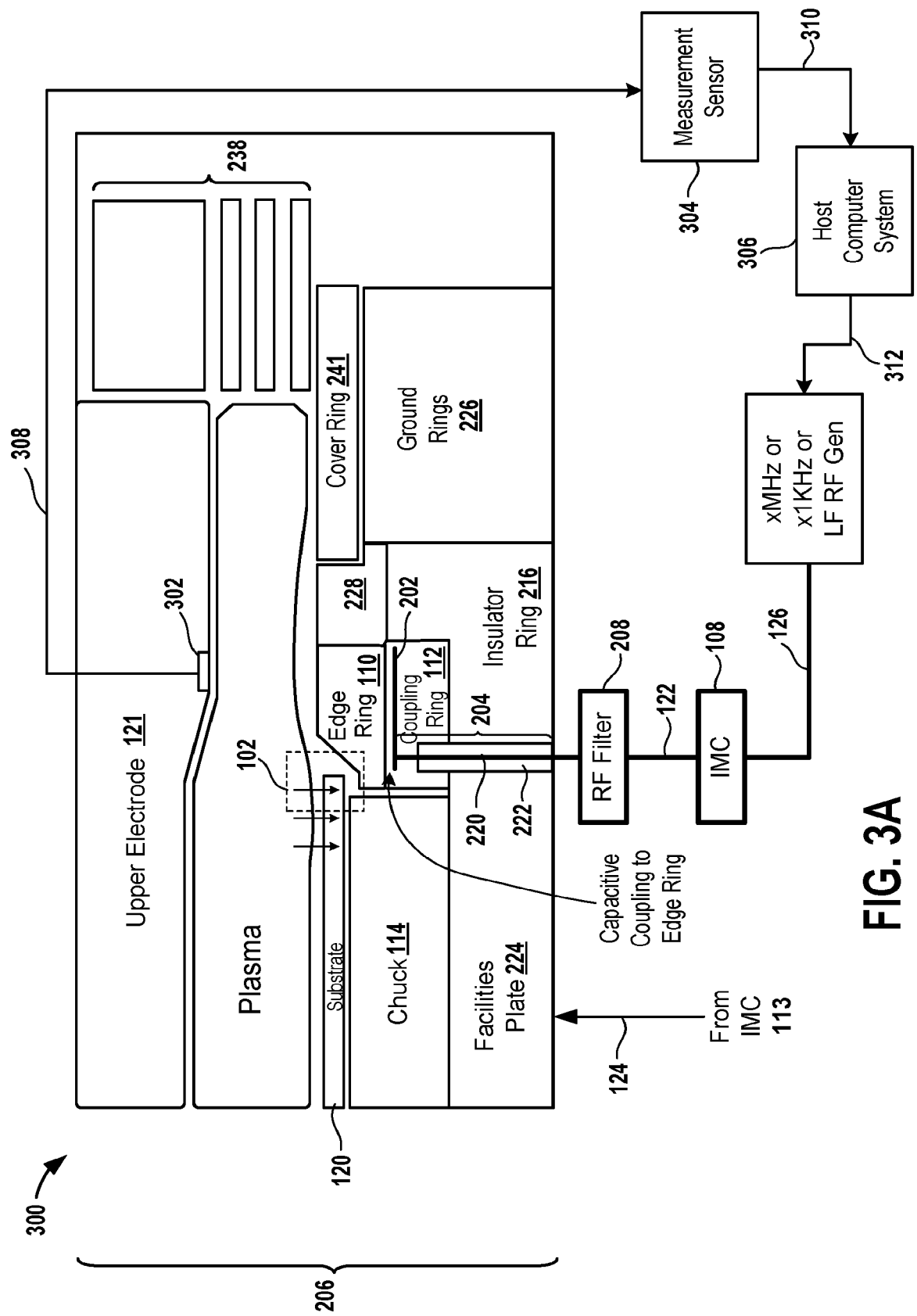
FIG. 3A is a diagram of an embodiment of a system to illustrate use of ion flux to tune power supplied by an x megahertz (MHz) RF generator or an x1 kilohertz (kHz) RF generator to control impedance of plasma within the edge region to further control directionality of an ion flux in the edge region.

FIG. 3A is a diagram of an embodiment of a system 300 to illustrate tuning of power supplied by the x MHz RF generator or the x1 kHz RF generator to control the impedance of the plasma within the edge region 102 to further control directionality of the ion flux in the edge region 102.

The system 300 is the same as the system 200 of FIG. 2A except that the system 300 further includes a planar ion flux probe 302, a measurement sensor 304 and a host computer system 306. An example of the planar ion flux probe is a Langmuir probe. Examples of the host computer system 306 include a computer, a tablet, a smart phone, etc. Examples of the measurement sensor 304 include a complex voltage sensor or a complex current sensor.

The planar ion flux probe 302 is inserted via an opening in the upper electrode 121 and has a spacer between a conductive portion, e.g., silicon, etc., of the ion flux probe 302 and the upper electrode 121. The planar ion flux probe 302 has a portion, e.g., a cylindrical portion, a polygonal portion, etc., that has a surface that is exposed to the plasma associated with the edge region 102. The planar ion flux probe 302 is coupled via an RF cable 308 to the measurement sensor 304, which is coupled via a transfer cable 310, e.g., a serial transfer cable, a parallel transfer cable, a Universal Serial Bus (USB) cable, etc., to the host computer system 306. The host computer system 306 is coupled via a transfer cable 312, e.g., a serial transfer cable, a parallel transfer cable, a USB cable, etc., to the x MHz RF generator or the x1 kHz RF generator. A serial transfer cable is used to transfer data serially, e.g., one bit at a time, etc. A parallel transfer cable is used to transfer data in a parallel manner, e.g., multiple bits at a time, etc.

The planar ion flux probe 302 measures ion flux, e.g., an amount of ion flow per unit surface area of the ion flux probe 302, an amount of current per unit surface area of the ion flux probe 302, etc., of the plasma associated with the edge region 102 to generate an RF signal. The RF signal passes via the RF cable 308 to the measurement sensor 304, which measures a complex voltage or a complex current of the RF signal. The measurement sensor 304 outputs the measured complex voltage or the measured complex current as data via the transfer cable 310 to the host computer system 306. The host computer 306 includes a processor and a memory device. Examples of the processor include a central processing unit (CPU), a controller, an application specific integrated circuit (ASIC), or a programmable logic device (PLD), etc. Examples of the memory device include a read-only memory (ROM), a random access memory (RAM), a hard disk, a volatile memory, a non-volatile memory, a redundant array of storage disks, a Flash memory, etc.

The processor of the host computer system 306 determines an amount of power to be supplied by the x MHz RF generator or the x1 kHz RF generator that is coupled to the IMC 108 based on the measured complex voltage or the measured complex current. For example, a correspondence, e.g., a one-to-one relationship, an association, a mapping, etc., between a pre-determined complex voltage or a pre-determined complex current and the power that is supplied by the x MHz RF generator or the x1 kHz RF generator is stored in the memory device that is coupled to the processor. The pre-determined complex voltage or the pre-determined complex current corresponds to, e.g., has a one-to-one relationship with, is mapped to, etc., a pre-determined amount of ion flux to be generated within the edge region 102, and the relationship is stored in the memory device of the host computer system 306. The processor determines from the measured complex current that the measured complex current does not match or is not within a pre-determined range from the pre-determined complex current to be achieved. The processor determines based on the correspondence between the pre-determined complex current and an amount of power to be supplied by the x MHz RF generator or the x1 kHz RF generator the amount of power. The processor generates a control signal indicating to the x MHz RF generator or the x1 kHz RF generator that the amount of power is to be supplied by the x MHz RF generator or the x1 kHz RF generator.

In one embodiment, the processor determines from the measured complex voltage that the measured complex voltage does not match or is not within a pre-determined range from the pre-determined complex voltage to be achieved. The processor determines based on the correspondence between the pre-determined complex voltage and the amount of power to be supplied by the x MHz RF generator or the x1 kHz RF generator the amount of power. The processor generates a control signal indicating to the x MHz RF generator or the x1 kHz RF generator that the amount of power is to be supplied by the x MHz RF generator or the x1 kHz RF generator.

Upon receiving the amount of power, the x MHz RF generator or the x1 kHz RF generator generates and supplies and RF signal having the amount of power via the RF cable 126 to the IMC 108. The IMC 208 matches an impedance of the load coupled to the IMC 208 with that of the source coupled to the IMC 108 to generate a modified RF signal from the RF signal received from the x MHz RF generator or the x1 kHz RF generator. The modified RF signal is provided to the electrode 202 via the RF filter 208, the feed ring coupled to the RF filter 208, and the coax cable 220. The capacitance between the electrode 202 and a lower surface of the edge ring 110 changes when the electrode 202 receives the modified RF signal to change an impedance of the plasma within the edge region 102 to further modify a direction of the ion flux within the edge region 102.

Figure 3B:
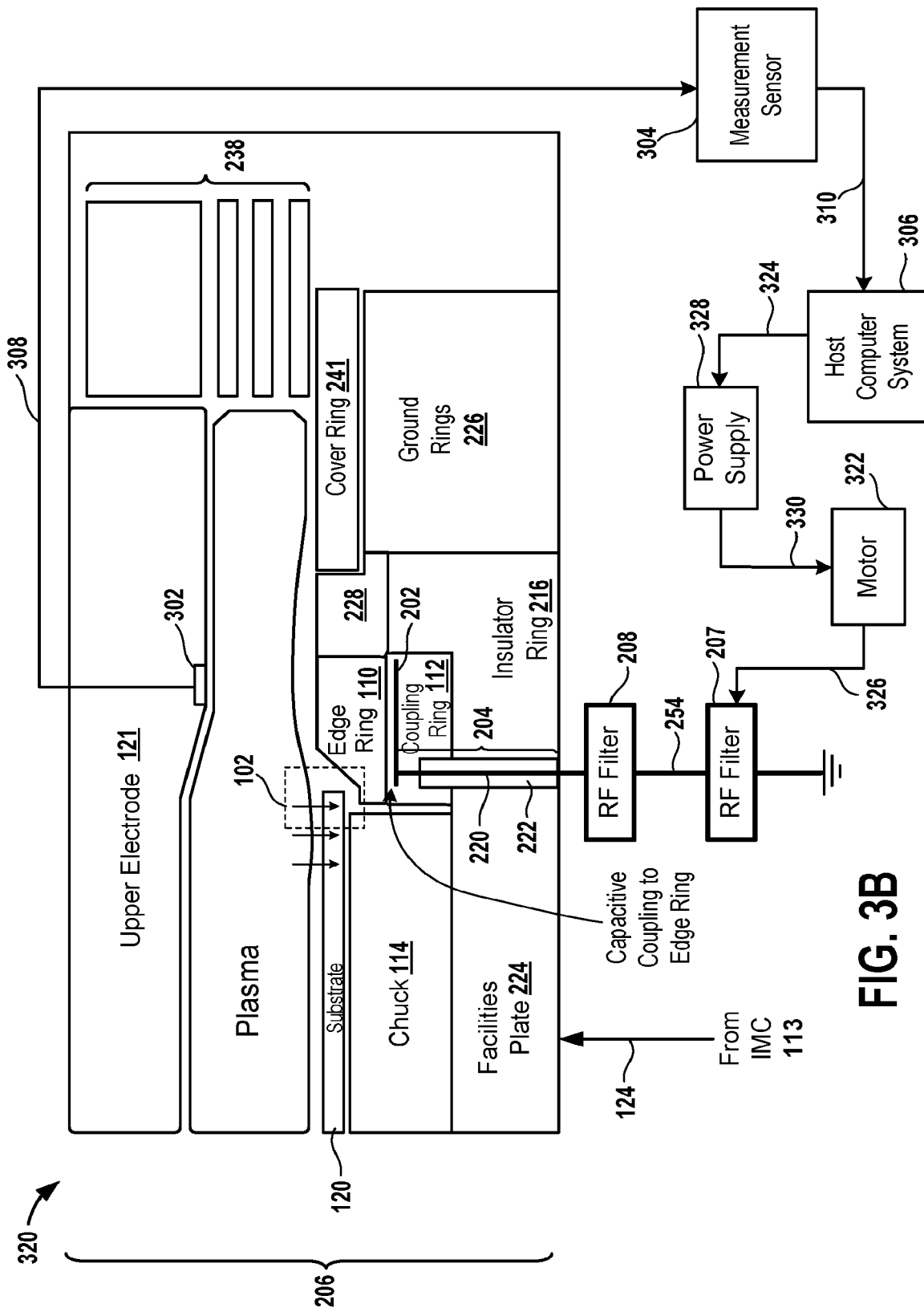
FIG. 3B is a diagram of an embodiment of a system to illustrate use of ion flux to tune an RF filter to control the impedance within the edge region to further control directionality of the ion flux within the edge region.

FIG. 3B is a diagram of an embodiment of a system 320 to illustrate tuning of the RF filter 207 to control the impedance within the edge region 102 to further control directionality of the ion flux within the edge region 102. The system 320 is the same as the system 250 (FIG. 2B) except that the system 320 includes the planar ion flux probe 302, the measurement sensor 304, the host computer system 306, a power supply 328, and a motor 322, e.g., a DC motor, an alternating current (AC) motor, etc. Examples of the power supply 328 include an AC power supply or a DC power supply. The power supply 328 is coupled to the host computer system 306 via a transfer cable 324. Moreover, the motor 322 is coupled to the power supply 328 via a cable 330 and is coupled to the RF filter 207 via a connection mechanism 326. Examples of the connection mechanism 326 include one or more rods, one or more gears, or a combination thereof. The connection mechanism 326 is connected to a circuit component, e.g., an inductor, a capacitor, etc., of the RF filter 207 to change a parameter, e.g., capacitance, inductance, etc., of the circuit component. For example, the connection mechanism 326 rotates to change an area between two parallel plates of a capacitor of the RF filter 207 and/or a distance between the plates. As another example, the connection mechanism 326 to displace a core surrounded by a coil of an inductor of the RF filter 207 to change an inductance of the inductor.

The processor determines from the complex current, measured by the measurement sensor 304, that the measured complex current does not match or is not within the pre-determined range from the pre-determined complex current to be achieved. The processor determines based on the correspondence among the pre-determined complex current, an amount of power, e.g., DC power, AC power, etc., to be supplied by the power supply 328 and a pre-determined capacitance of the RF filter 207 to be achieved, the amount of power. The processor generates a control signal indicating to the power supply 328 that the amount of power is to be supplied by the power supply 328 to achieve the pre-determined capacitance of the RF filter 207.

In one embodiment, the processor determines from the measured complex voltage that the measured complex voltage does not match or is not within the pre-determined range from the pre-determined complex voltage to be achieved. The processor determines based on the correspondence among the pre-determined complex voltage, the pre-determined capacitance of the RF filter 207 to be achieved, and the amount of power to be supplied by the power supply 328, the amount of power. The processor generates a control signal indicating to the power supply 328 that the amount of power is to be supplied by the power supply 328.

The control signal is sent via the transfer cable 324 to the power supply 328. Upon receiving the amount of power, the power supply 328 generates and supplies the amount of power via the cable 330 to the motor 322. A stator of the motor 322 receives the amount of power to generate an electric field, which rotates a rotor of the motor 322. The rotation of the rotor rotates the connection mechanism 326 to change the parameter of the RF filter 207 to achieve the pre-determined capacitance. The change in the parameter, e.g., the capacitance, etc., changes an amount of RF power that flows via the RF filter 207 to the ground coupled to the RF filter 207 to further change the capacitance between the electrode 202 and the edge ring 110. The capacitance between the electrode 202 and the edge ring 110 is changed via the RF cable 254, the RF filter 208, the feed ring coupled to the RF filter 208, and the coax cable 220. The change in the capacitance changes an amount of power of the filtered signal flowing from the RF filter 207 to the RF filter 208 via the RF transmission line 254. The change in the amount of power changes an impedance of the plasma within the edge region 102 to further modify the directionality of the ion flux within the edge region 102.

Figure 3C:
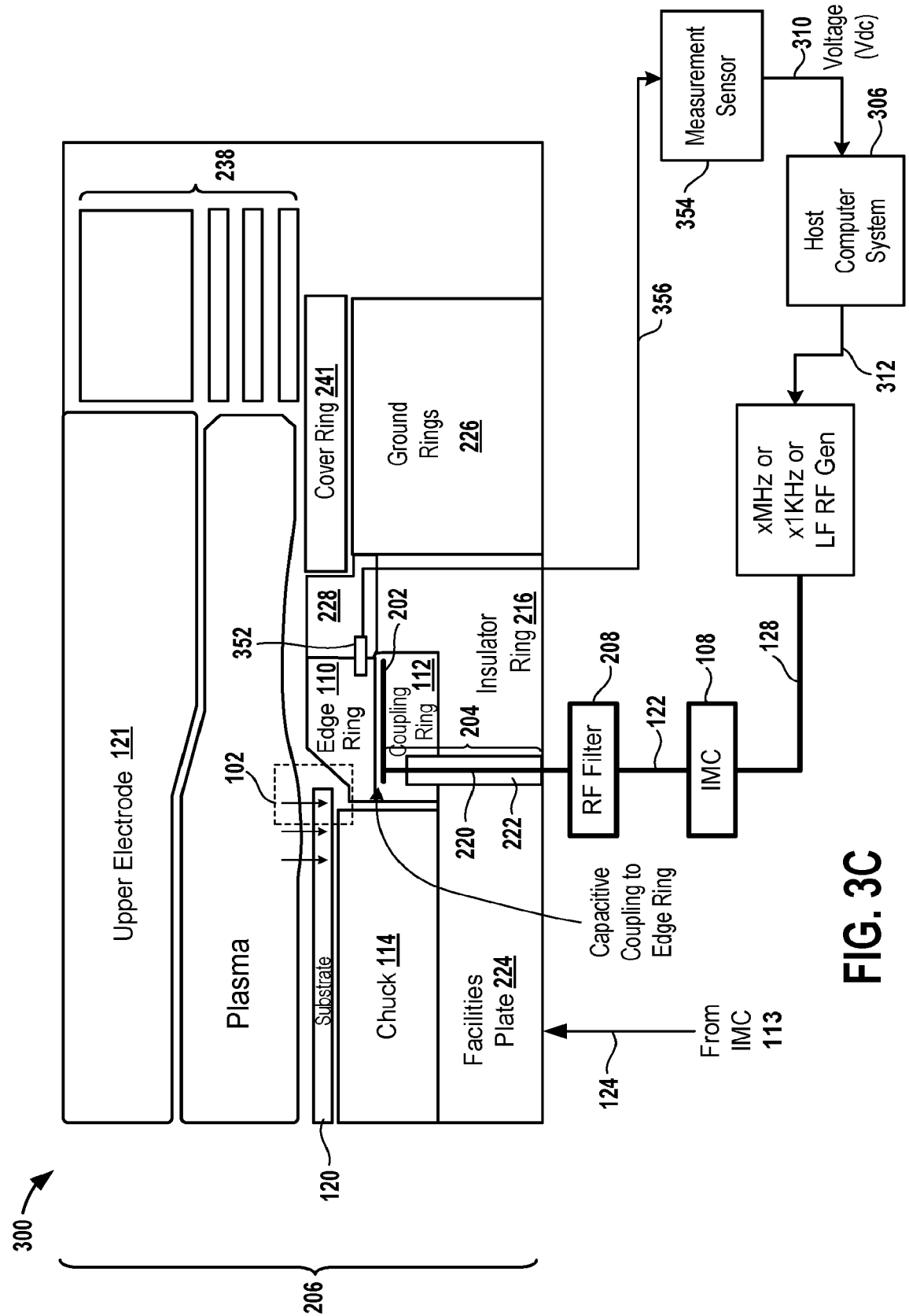
FIG. 3C is a diagram of an embodiment of a system to illustrate use of direct current (DC) bias to tune power supplied by the x MHz RF generator or the x1 kHz RF generator to control the impedance of the plasma within the edge region to further control directionality of the ion flux in the edge region.

FIG. 3C is a diagram of an embodiment of a system 350 to illustrate use of DC bias to tune power supplied by the x MHz RF generator or the x1 kHz RF generator to control the impedance of the plasma within the edge region 102 to further control directionality of the ion flux in the edge region 102. The system 350 is the same as the system 300 (FIG. 3A) except that the system 350 includes a measurement sensor 354, and a DC bias probe 352 instead of the planar ion flux probe 302 (FIG. 3A) and the measurement sensor 304 (FIG. 3A). An example of the measurement sensor 354 is a DC bias voltage sensor.

A portion of the DC bias sensor 352 is extended into the edge ring 110 via an opening in the edge ring 110 and the remaining portion of the DC bias sensor 352 is extended into the insulator ring 228 via an opening in the insulator ring 228. The DC bias sensor 352 is connected to the measurement sensor 354 via a cable 356 to the measurement sensor 354. The measurement sensor 354 provides a measurement of a DC bias, e.g., a DC bias voltage, etc., that is generated by RF power of the edge ring 110. The RF power of the edge ring 110 is based on RF power of the plasma within the edge region 102. The measurement sensor 354 is connected to the host computer system 306 via the transfer cable 310.

The DC bias probe 352 senses a DC bias voltage of the edge ring 110 to generate an electrical signal and the DC bias voltage is induced by RF power of the plasma in the edge region 102. The electrical signal is sent via the cable 356 to the measurement sensor 354, which measures the DC bias voltage based on the electrical signal. An amount of the measured DC bias voltage is sent as data from the measurement sensor 354 via the transfer cable 310 to the host computer system 306.

The processor of the host computer system 306 determines an amount of power to be supplied by the x MHz RF generator or the x1 kHz RF generator that is coupled to the IMC 108 based on the measured DC bias voltage. For example, a correspondence, e.g., a one-to-one relationship, an association, a mapping, etc., between a DC bias voltage and an amount of power that is supplied by the x MHz RF generator or the x1 kHz RF generator in the memory device that is coupled to the processor. The processor of the host computer system 306 determines from the measured DC bias voltage that the measured DC bias voltage does not match or is not within a pre-determined range from a pre-determined DC bias voltage to be achieved. The processor determines based on the correspondence between the pre-determined DC bias voltage and an amount of power to be supplied by the x MHz RF generator or the x1 kHz RF generator the amount of power. The processor generates a control signal indicating to the x MHz RF generator or the x1 kHz RF generator that the amount of power is to be supplied by the x MHz RF generator or the x1 kHz RF generator.

Upon receiving the amount of power, the x MHz RF generator or the x1 kHz RF generator generates and supplies an RF signal having the amount of power via the RF cable 126 to the IMC 108. The IMC 108 matches an impedance of the load coupled to the IMC 208 with that of the source coupled to the IMC 108 to generate a modified RF signal from the RF signal received from the x MHz RF generator or the x1 kHz RF generator. The modified RF signal is provided to the electrode 202 via the RF filter 208, the feed ring coupled to the RF filter 208, and the coax cable 220. The capacitance between the electrode 202 and the edge region 110 changes when the electrode 202 receives the modified RF signal to change an impedance of the plasma within the edge region 102 to further modify a direction of the ion flux within the edge region 102.

Figure 3D:
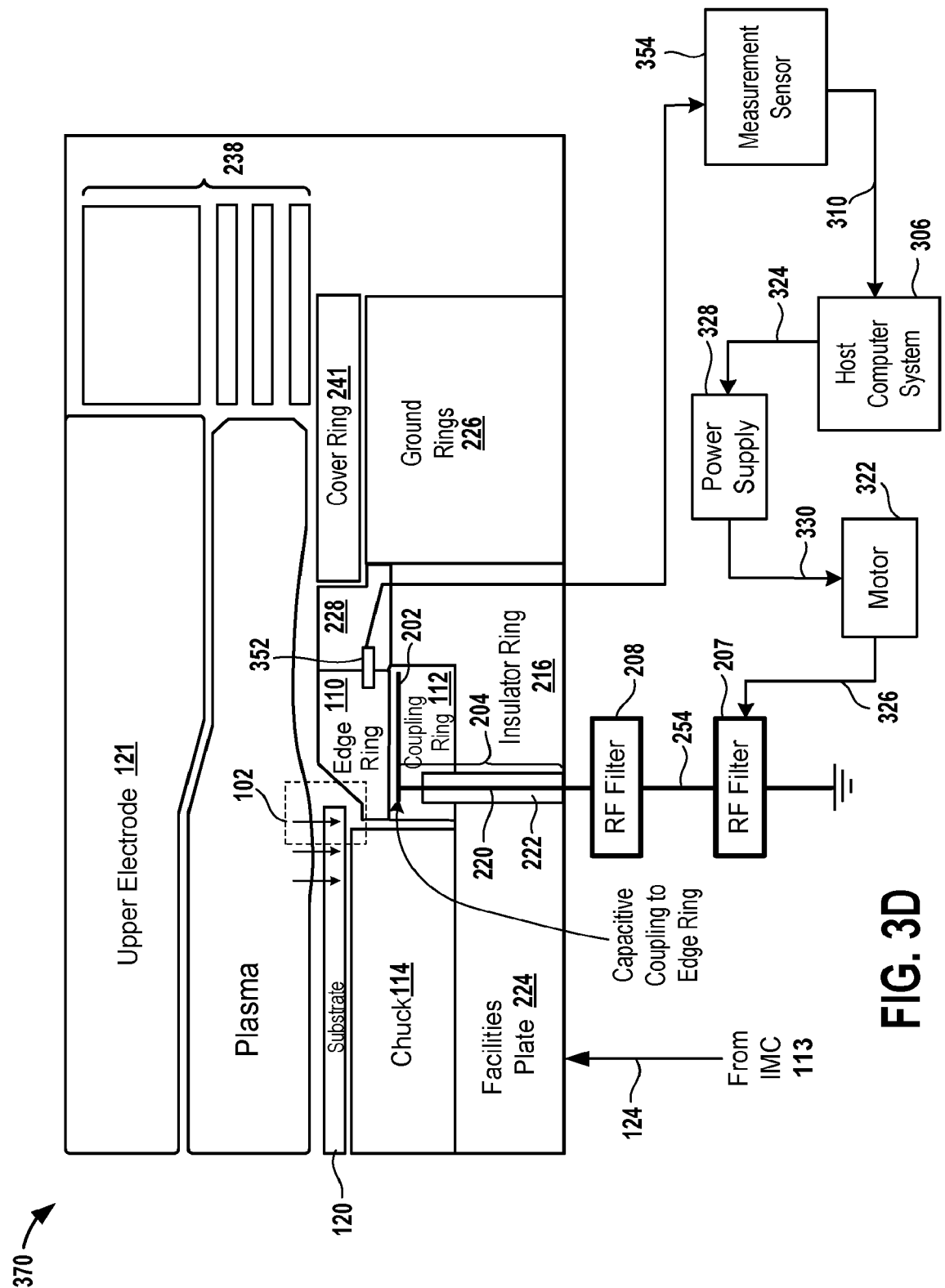
FIG. 3D is a diagram of an embodiment of a system to illustrate use of the DC bias to tune the RF filter to control the impedance of the plasma within the edge region to further control directionality of the ion flux in the edge region.

FIG. 3D is a diagram of an embodiment of a system 370 to illustrate use of DC bias voltage to tune the RF filter 207 to control the impedance of the plasma within the edge region 102 to further control directionality of the ion flux in the edge region 102. The system 370 is the same as the system 320 (FIG. 3B) except that the system 370 includes the measurement sensor 354, and the DC bias probe 352 instead of the planar ion flux probe 302 (FIG. 3B) and the measurement sensor 304 (FIG. 3B). As explained above with reference to FIG. 3C, the measurement sensor 354 outputs the measured DC bias voltage to the host computer system 306 via the transfer cable 310.

The processor of the host computer system 306 determines an amount of power to be supplied by the power supply 328 based on the measured DC bias voltage. For example, a correspondence, e.g., a one-to-one relationship, an association, a mapping, etc., between a DC bias voltage and an amount of power that is supplied by the power supply 328 is stored in the memory device that is coupled to the processor. The processor of the host computer system 306 determines from the measured DC bias voltage that the measured DC bias voltage does not match or is not within a pre-determined range from a pre-determined DC bias voltage to be achieved. The processor determines based on the correspondence between the pre-determined DC bias voltage and the amount of power to be supplied by the power supply 328 the amount of power. The processor generates a control signal indicating to the power supply 328 that the amount of power is to be supplied by the power supply 328.

The control signal is sent via the transfer cable 324 to the power supply 328. Upon receiving the amount of power, as described above with reference to FIG. 3B, the power supply 328 generates and supplies the amount of power via the cable 330 to the motor 322, which rotates to change the parameter of the RF filter 207, and the change in the parameter changes the capacitance between the electrode 202 and the edge ring 110. The capacitance between the electrode 202 and the edge ring 110 is changed to change the impedance of the plasma within the edge region 102 to further change the directionality of the ion flux within the edge region 102.

In some embodiments, a current, e.g., a complex current, etc., or a voltage, e.g., a DC bias voltage, a complex voltage, etc., is referred to herein as a variable.

FIG. 4A is a diagram of an embodiment of a mesh electrode 402, which is embedded within the coupling ring 112 (FIG. 1). The mesh electrode 402 includes multiple crossings of wires to form a net-like structure and is an example of the electrode 202 (FIG. 2A). The mesh electrode 402 is made of a metal, e.g., aluminum, copper, etc.

FIG. 4B is a diagram of an embodiment of a ring shaped electrode 404, which is an example of the electrode 202 (FIG. 2A). The ring shaped electrode 404 is tubular in structure or flat, e.g., plate-shaped, etc., in structure. The ring shaped electrode 404 is made of a metal, e.g., aluminum, copper, etc.

Figure 5:
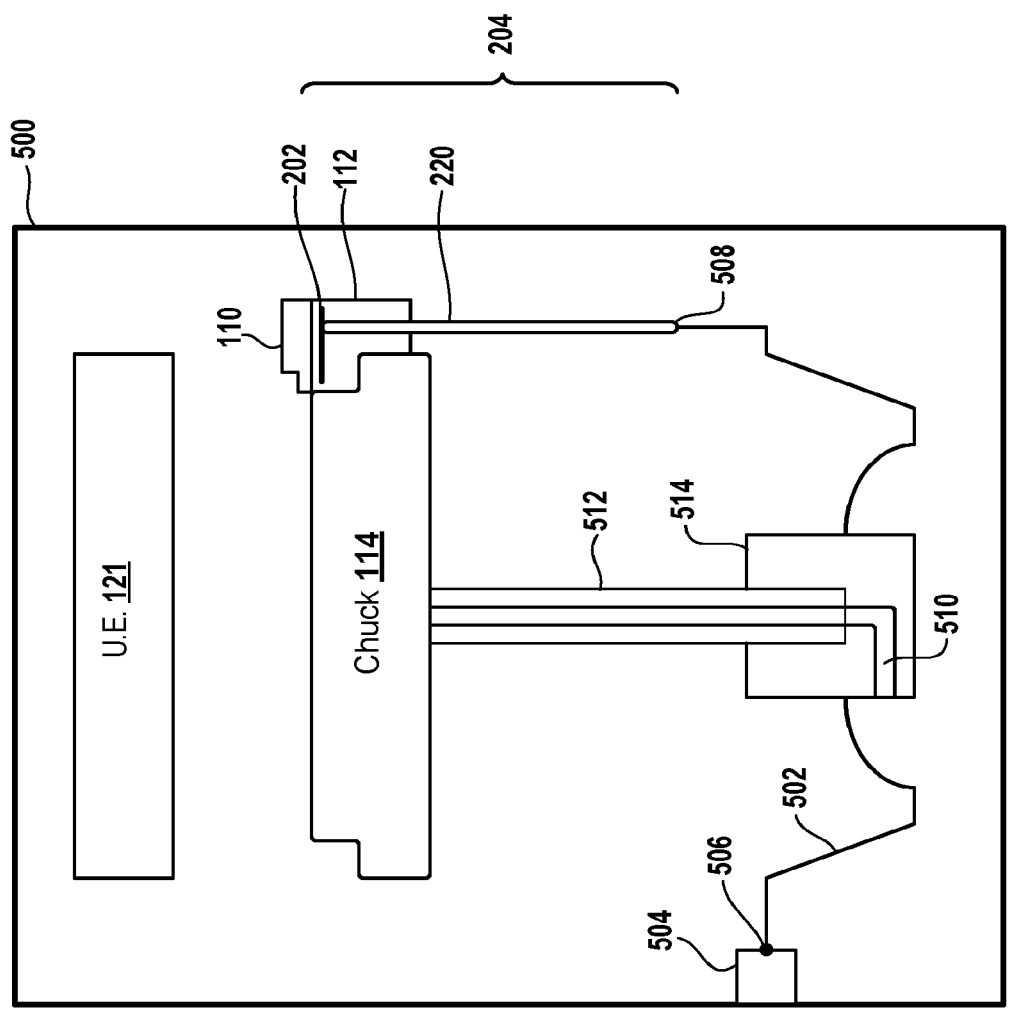
FIG. 5 is a diagram of an embodiment of a plasma chamber to illustrate a portion of a feed ring and a connection between the portion and a power pin.

FIG. 5 is a diagram of an embodiment of a plasma chamber 500 to illustrate a portion of a feed ring 502 and a connection between the portion and the power pin 204. The plasma chamber 500 is an example of the plasma chamber 104 (FIG. 1). The feed ring 502 is connected at one end 506 to an RF rod 504 of the RF transmission line 122 (FIG. 1) and at an opposite end 508 to the coax cable 220 of the power pin 204. The plasma chamber 500 includes an RF rod 510 of the RF transmission line 124 (FIG. 1). The RF rod 510 is situated within an RF cylinder 512, which is surrounded at its bottom portion by another RF cylinder 514.

The modified RF signal that is sent via the RF transmission line 122 from the IMC 108 is sent via the RF rod 504 of the RF transmission line 122 and the end 506 to the feed ring 502. A portion of the modified RF signal transfers from the end 506 via the end 508 and the coax cable 220 to the electrode 202 embedded within the coupling ring 112 for providing capacitive coupling between the electrode 202 and the edge ring 110.

In some embodiments in which the passive power is provided to the electrode 202, the RF rod 504 is of the RF transmission line 254 instead of the RF transmission line 122 (FIG. 1). The RF transmission line 254 couples the RF filter 207 to the RF filter 208 (FIG. 2B).

In various embodiments, the RF filter 208 is coupled to the RF rod 504 of the RF transmission line 254 and is coupled to the feed ring 502. For example, in an embodiment in which passive RF power is flowing from the ground that is connected to the RF filter 207 towards the electrode 202, an input of the RF filter 208 is coupled to the RF rod 504 and an output of the RF filter 208 is coupled to the feed ring 502. As another example, in an embodiment in which passive RF power from the edge region 102 is flowing to the ground that is coupled to the RF filter 207, an input of the RF filter 208 is coupled to the feed ring 502 and an output of the RF filter 208 is coupled to the RF rod 504. As yet another example, the RF filter 208 is coupled to the end 506 of the arm 716 and is coupled to the RF rod 504.

In an embodiment in which the active power is used, an input of the RF filter 208 is coupled to the RF rod 504 that is further coupled to the IMC 108 (FIG. 2A) and an output of the RF filter 208 is coupled to the feed ring 502.

Figure 6:
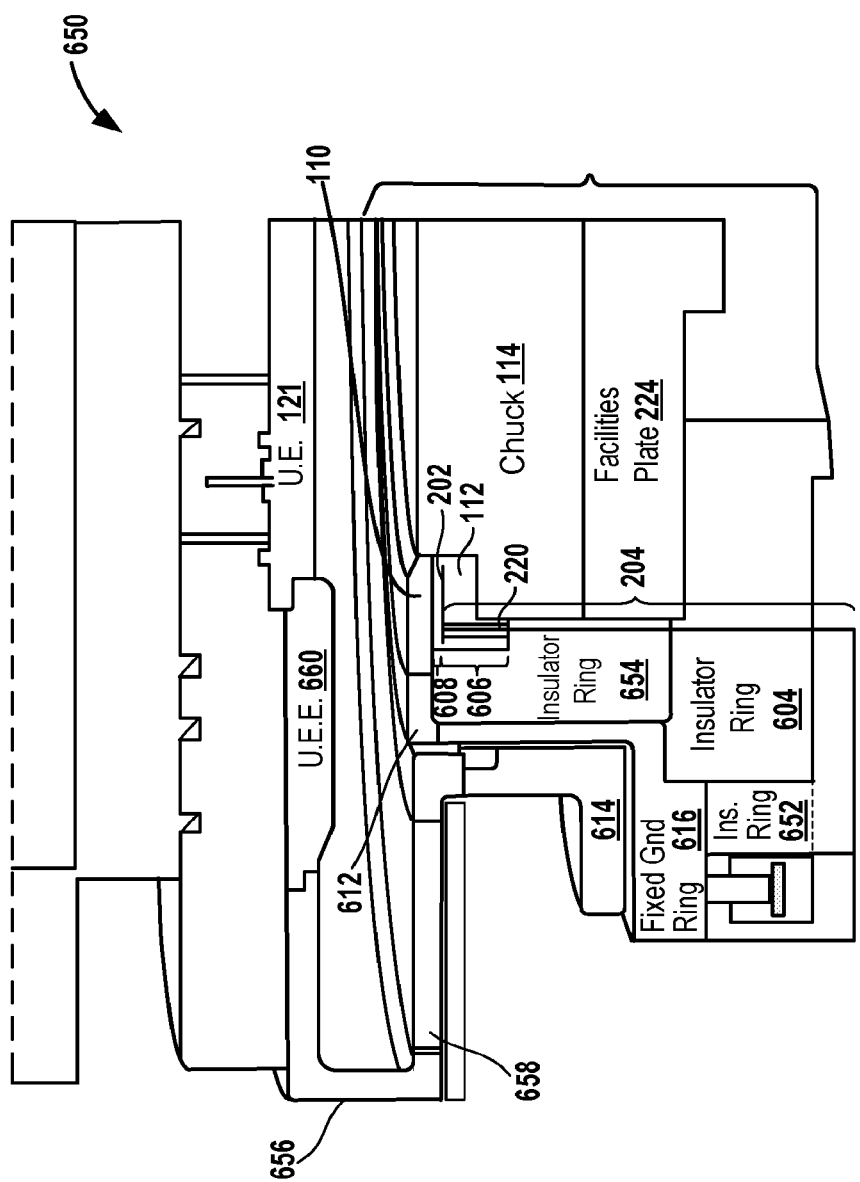
FIG. 6 is a diagram of an embodiment of a portion of the plasma chamber to illustrate a location of the electrode with respect to the remaining components of the plasma chamber.

FIG. 6 is a diagram of an embodiment of a portion 650 of a plasma chamber, which is an example of the plasma chamber 104 (FIG. 1), to illustrate a location of the electrode 202 with respect to the remaining components of the plasma chamber. The portion 650 include an insulator ring 652 of the plasma chamber. The insulator ring 652 surrounds a portion of an insulator ring 604 and a portion of the insulator ring 652 is located below the insulator ring 604. The insulator ring 604 is located below another insulator ring 654.

The insulator ring 654 is adjacent to the coupling ring 112 and is below an insulator ring 612 that surrounds the edge ring 110. The coupling ring 112 is adjacent to the chuck 114. The edge ring 110 is overlaid on top of a portion 608 of the coupling ring 112. The portion 608 of the coupling ring 112 acts like a dielectric between the electrode 202 and a lower surface of the edge ring 110 so that capacitive coupling is established between the electrode 202 and the edge ring 110. The portion 608 creates a dielectric between the edge ring 110 and a remaining portion 606 of the coupling ring 112. The insulator ring 612 is surrounded by a movable ground ring 614, which is coupled to ground. The movable ground ring 614 is located on top of a fixed ground ring 616, which is also coupled to ground.

The insulator 654 is located adjacent to the chuck 114, the facilities plate 224, and the coupling ring 112 on its inner side and to the fixed ground ring 616 at its outer side. Moreover, the insulator ring 604 is located below the facilities plate 224, which supports the chuck 114. The fixed ground ring 616 is adjacent to and surrounds the insulator ring 654 and on top of the insulator ring 652.

The confinement rings 238 (FIGS. 2A & 2B) include a confinement ring portion 656 and a confinement ring horizontal portion 658, e.g., a slotted ring, etc. The upper electrode 121 is surrounded by an upper electrode extension 660.

The gap 232 formed between the upper electrode 121 and the chuck 114 is surrounded by the upper electrode 121, the upper electrode extension 660, the confinement ring portion 656, the confinement ring horizontal portion 658, the insulator ring 612, the edge ring 110, and the chuck 114.

The coupling ring 112 is surrounded by the edge ring 110, the insulator ring 654, and the chuck 114. For example, the coupling ring 112 is adjacent to the chuck 114, the edge ring 110, and the insulator ring 654. As another example, the edge ring 110 is located on top of the coupling ring 112 in which the electrode 202 is embedded, the chuck 114 is located adjacent to an inner side of the coupling ring 112, and the insulator ring 654 is located adjacent to an outer side of the coupling ring 112. The coax cable 220 passes via the insulator ring 604 and the insulator ring 654 to be connected to the electrode 202 located within the portion 606 of the coupling ring 112.

Figure 7:
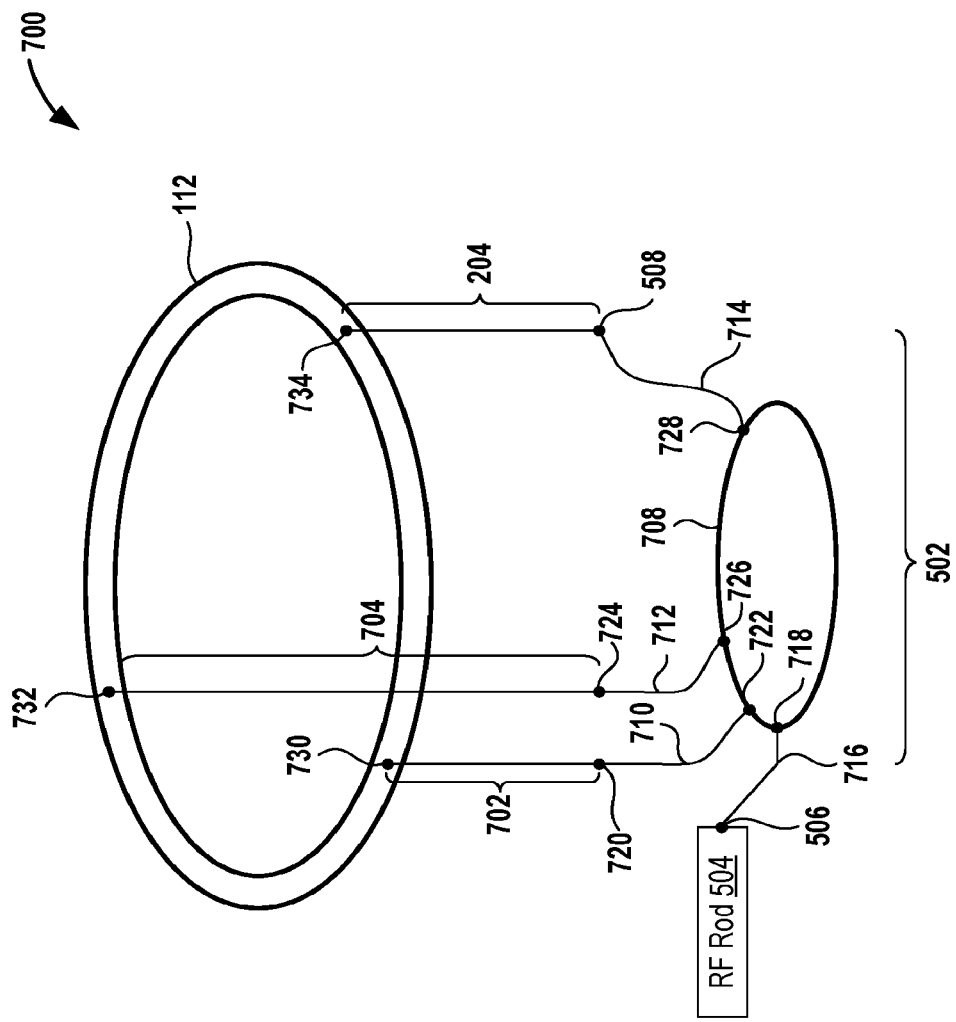
FIG. 7 is a diagram of an embodiment of a system for illustrating the feed ring that is coupled to an RF rod.

FIG. 7 is a diagram of an embodiment of a system 700 for illustrating the feed ring 502 that is coupled to the RF rod 504. The feed ring 502 includes a circular portion 708 that is connected to multiple arms 710, 712, 714, and 716. The circular portion 708 is flat or is ring-shaped. The arm 716 is connected at the end 506 to the RF rod 504 and at an opposite end 718 to the circular portion 708. For example, the arm 716 is fitted to the RF rod 504 at the end 506 via a fitting mechanism, e.g., a screw, a bolt, a clamp, a nut, or a combination thereof, etc. Similarly, the arm 710 is connected at an end 720 to a power pin 702. For example, the arm 710 is fitted to the power pin 702 at the end 720 via the fitting mechanism. The power pin 702 is the same in structure and function as that of the power pin 204. For example, the power pin 702 includes a coax cable and a sleeve that surrounds at least a portion of the coax cable. The arm 710 is connected at an opposite end 722 to the circular portion 708.

Moreover, the arm 712 is connected at an end 724 to a power pin 704, which is the same in structure and function as that of the power pin 204. For example, the power pin 704 includes a coax cable and a sleeve that surrounds at least a portion of the coax cable. As an example, the arm 712 is fitted to the power pin 704 at the end 724 via the fitting mechanism. The arm 712 is connected at an opposite end 726 to the circular portion 708.

Furthermore, the arm 714 is connected at the end 508 to the power pin 204. The arm 714 is connected at an opposite end 728 to the circular portion 708. The arm 710 extends from the circular portion 708 to connect to the coax cable of the power pin 702, the arm 712 extends from the circular portion 708 to connect to the coax cable of the power pin 704, and the arm 714 extends from the circular portion 798 to connect to the coax cable 220 of the power pin 204. The power pin 702, e.g. the coax cable of the power pin 702, etc., is connected at a point 730 to the electrode 202 embedded within the coupling ring 112. Moreover, the power pin 704, e.g. the coax cable of the power pin 704, etc., is connected at a point 732 to the electrode 202, and the power pin 204, e.g., the coax cable 220, etc., is connected at a point 734 to the electrode 202.

The modified RF signal that is received via the RF rod 504 and the impedance matching circuit 108 (FIG. 1) is sent via the arm 716 to the circular portion 708, and is divided between the arms 710, 712, and 714. A portion of power of the modified RF signal passes via the arm 710 and the power pin 702, e.g. the coax cable of the power pin 702, etc., to the electrode 202, another portion of the power of the modified RF signal passes via the arm 712 and the power pin 704, e.g. the coax cable of the power pin 704, etc., to the electrode 202, and yet another portion of the power passes via the arm 714 and the power pin 204, e.g., the coax cable 220, etc., to the electrode 202.

In some embodiments, the feed ring 502 includes any other number of arms, e.g., two, one, four, five, etc., that extend from the circular portion 708 to connect to the electrode 202 within the coupling ring 112.

In various embodiments, instead of the circular portion 708, a portion of another shape, e.g., oval, polygonal, etc., is used.

FIG. 8A is an embodiment of a graph 800 to illustrate a change in a normalized etch rate of a wafer that is processed within the plasma chamber 104 with a change is an amount of power that is supplied to the electrode 202 (FIG. 2A). The wafer is an example of the substrate 120 (FIG. 1). The graph 800 plots the normalized etch rate versus a radius of the wafer when the chuck 114 of the plasma chamber 104 (FIG. 1) is supplied with RF power from the x1 kHz and z MHz RF generators via the IMC 113 (FIG. 1), and the electrode 202 is supplied with RF power from the x MHz RF generator via the IMC 108 (FIG. 1).

The graph 800 includes three plots 802, 804, and 806. The plot 802 is generated when an amount of RF power P1 of the x MHz RF generator is supplied via the IMC 108 to the electrode 202. The plot 804 is generated when an amount of RF power P2 of the x MHz RF generator is supplied via the IMC 108 to the electrode 202 and the plot 806 is generated when an amount of RF power P3 of the x MHz RF generator is supplied via the IMC 108 to the electrode 202. The power P3 is greater than the power P2, which is greater than the power P1.

FIG. 8B is a diagram of a portion of the plasma chamber 104 (FIG. 1) to illustrate a change in directionality of ion flux with a change in the amount of power that is supplied to the electrode 202. When the amount of power P1 is supplied to the electrode 202, a directionality 812a of ion flux 810 is such that the ions are not vertically directed towards the substrate 120 but are directed at a negative angle $-\theta$, with respect to a 90 degree ion incidence angle, which is perpendicular to a diameter of the coupling ring 112. The angle $\theta$ is measured with respect to a vertical axis perpendicular to the diameter of the coupling ring 112. This increases an etch rate of etching the substrate 120 in the edge region 102.

Moreover, when the amount of power P2 is supplied to the electrode 202, a directionality 812b of the ion flux 810 is such that the ions are vertically directed, e.g. $\theta=0$. The power P2 increases voltage of the edge ring 110 compared to the power P1. This decreases an etch rate of etching the substrate 120 in the edge region 102 compared to when the amount of power P1 is supplied. The etch rate is decreased to achieve a uniform etch rate at the edge region 102 and to achieve a flat plasma sheath at the edge region 102. For example, there is little or no difference between levels of a plasma sheath over the wafer and over the edge ring 110.

Also, when the amount of power P3 is supplied to the electrode 202, a directionality 812c of the ion flux 810 is such that the ions are not vertically directed towards the substrate 120 but are directed at a positive angle $\theta$. This decreases an etch rate of etching the substrate 120 in the edge region 102 compared to when the amount of power P2 is supplied. By controlling an amount of power supplied to the electrode 202, a directionality of the ion flux 810 is controlled via the power pin 204 (FIG. 2A) and the electrode 202.

In some embodiments, instead of increasing the power that is supplied by the electrode 202, an amount of capacitance of the RF filter 207 (FIG. 2B) is increased to change the angle $\theta$ from a negative value to zero further to a positive value to control directionality of the ion flux 810.

Figure 9B:
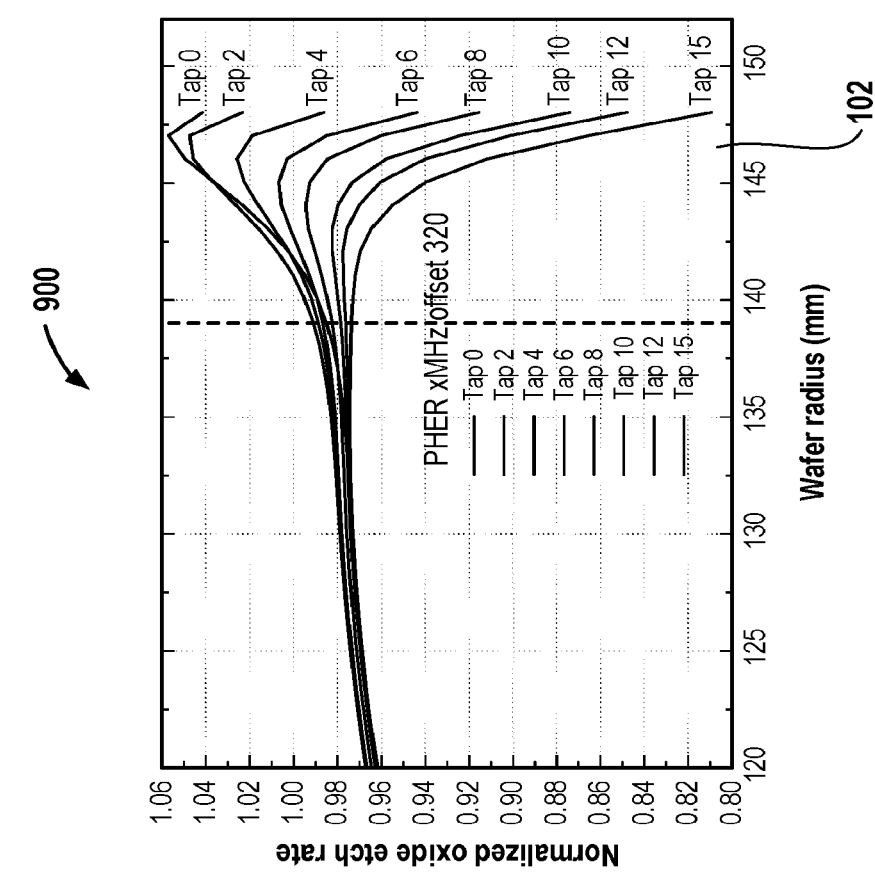
FIG. 9B is an embodiment of a graph that plots a peak voltage of the edge ring versus a capacitance of the passive RF filter of FIG. 9A.
Figure 9A:
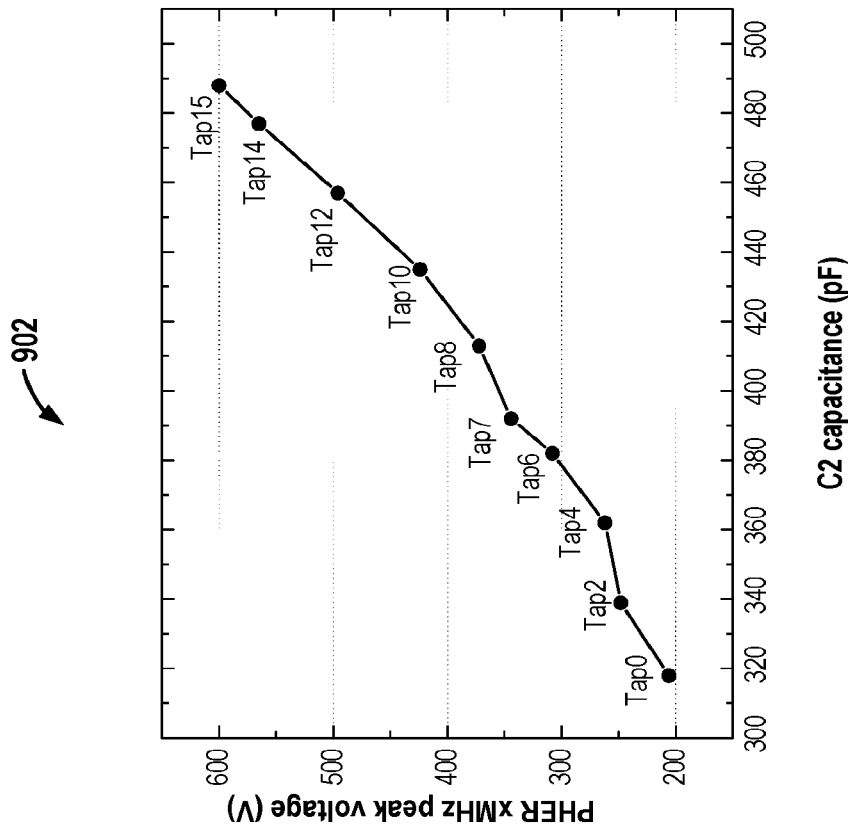
FIG. 9A is an embodiment of a graph to illustrate a change in an etch rate of etching a substrate with a change in a capacitance of an RF filter.

FIG. 9A is an embodiment of a graph 900 to illustrate a change in an etch rate of etching the substrate 120 (FIG. 1) with a change in a capacitance of the RF filter 207 (FIG. 2B). The graph 900 plots the normalized etch rate versus the radius of the wafer for various values of capacitances of the RF filter 207. As a capacitance of the RF filter 207 increases, an etch rate of the wafer at the edge region 102 (FIG. 1) decreases to achieve more uniformity in the etch rate.

FIG. 9B is an embodiment of a graph 902 that plots a peak voltage of the edge ring 110 (FIG. 1) versus the capacitance of the RF filter 207 (FIG. 2B). As the capacitance of the RF filter 207 increases, the peak voltage of the edge ring 110 increases to change the directionality of the ion flux 810 (FIG. 8B) from negative $\theta$ to zero to positive $\theta$.

It should be noted that in some of the above-described embodiments, an RF signal is supplied to the chuck 114 and the upper electrode 121 is grounded. In various embodiments, an RF signal is applied to the upper electrode 121 and the chuck 114 is grounded.

In some embodiments, each of the electrode 202 and the coupling ring 112 are segmented into a plurality of segments. Each of the segments of the electrode 202 is independently provided RF power from one or more RF generators.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as Application Specific Integrated Circuit (ASICs), programmable logic devices (PLDs), one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, one or more RF generators are coupled to an inductor within the ICP plasma chamber. Examples of a shape of the inductor include a solenoid, a dome-shaped coil, a flat-shaped coil, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A power transfer system comprising:
a ring-shaped portion;
a plurality of arms coupled to the ring-shaped portion;
a plurality of pins, wherein each of the plurality of pins is coupled to a corresponding one of the plurality of arms; and
an electrode coupled to the plurality of pins at different locations,
wherein the electrode is configured to receive radio frequency (RF) power at the locations via the plurality of arms and the plurality of pins from the ring-shaped portion.

2. The power transfer system of claim 1, wherein the ring-shaped portion is a circular portion of a feed ring.

3. The power transfer system of claim 1, wherein each of the plurality of pins includes a coaxial cable and a sleeve, wherein the sleeve covers the coaxial cable and is fabricated from an insulator material, wherein each of the plurality of arms is coupled to a corresponding one of the coaxial cables.

4. The power transfer system of claim 1, wherein the plurality of pins include a first pin and a second pin, wherein the plurality of arms include a first arm and a second arm, wherein the first arm is coupled to the first pin and the second arm is coupled to the second pin.

5. The power transfer system of claim 1, wherein the electrode is configured to be embedded within a coupling ring.

6. The power transfer system of claim 1, wherein the ring-shaped portion is configured to be coupled via an arm to an RF rod of an RF transmission line.

7. The power transfer system of claim 1, wherein the ring-shaped portion is configured to be coupled via an arm and an RF filter to an RF rod of an RF transmission line.

8. The power transfer system of claim 1, wherein the electrode is a mesh electrode or a ring electrode.

9. A power transfer system comprising:
an arm;
a ring-shaped portion coupled to the arm;
a plurality of pins electrically coupled to the ring-shaped portion;
an electrode coupled to the plurality of pins,
wherein the electrode is configured to receive radio frequency (RF) power via the ring-shaped portion and the plurality of pins from the arm.

10. The power transfer system of claim 9, wherein the arm is configured to be coupled to an RF rod of an RF transmission line.

11. The power transfer system of claim 9, wherein the arm is configured to be coupled via an RF filter to an RF rod of an RF transmission line.

12. The power transfer system of claim 9, wherein the ring-shaped portion is a circular portion of a feed ring.

13. The power transfer system of claim 9, wherein each of the plurality of pins includes a coaxial cable and a sleeve, wherein the sleeve covers the coaxial cable and is fabricated from an insulator material.

14. The power transfer system of claim 9, wherein the plurality of pins are coupled to the electrode at different locations under the electrode.

15. The power transfer system of claim 9, wherein the electrode is configured to be embedded within a coupling ring.

16. The power transfer system of claim 9, wherein the electrode is a mesh electrode or a ring electrode.

17. A plasma electrode assembly comprising:
an edge ring; and
a coupling ring having an electrode, wherein the coupling ring is placed below the edge ring;
wherein the electrode is coupled to a plurality of pins,
wherein the plurality of pins are coupled to a plurality of arms,
wherein the plurality of arms are coupled to a ring-shaped portion,
wherein the electrode is configured to receive radio frequency (RF) power via the plurality of arms and the plurality of pins from the ring-shaped portion.

18. The plasma electrode assembly of claim 17, wherein the electrode is configured to be capacitively coupled to the edge ring via the coupling ring.

19. The plasma electrode assembly of claim 17, wherein the edge ring is configured to interface with a gap between the edge ring and an upper electrode of a plasma chamber.

20. The plasma electrode assembly of claim 17, wherein the ring-shaped portion is a circular portion of a feed ring.

* * * * *